United States Patent [19]

Tran

[11] Patent Number: 4,887,241
[45] Date of Patent: Dec. 12, 1989

[54] ECL PROM PROGRAMMING METHOD AND APPARATUS USING ECL ADDRESSING MEANS

[75] Inventor: Dung Q. Tran, San Jose, Calif.

[73] Assignee: Advanced Micro Devices, Inc., Sunnyvale, Calif.

[21] Appl. No.: 891,507

[22] Filed: Jul. 31, 1986

[51] Int. Cl.⁴ .................. G11C 8/00; G11C 7/00; G11C 17/00; G11C 11/36
[52] U.S. Cl. .................. 365/230.06; 365/230.08; 365/189.05; 365/189.08; 365/96; 365/175
[58] Field of Search ............... 365/96, 189, 230, 226, 365/230.06, 230.08, 189.08, 189.05, 175

[56] References Cited

U.S. PATENT DOCUMENTS

| | | | |
|---|---|---|---|
| 3,976,983 | 8/1976 | Moussie | 365/174 |
| 4,125,880 | 11/1978 | Taylor | 365/242 |
| 4,656,606 | 4/1987 | Ohno et al. | 365/104 |
| 4,701,636 | 10/1987 | Millhollan et al. | 307/270 |
| 4,722,822 | 2/1988 | Thai et al. | 365/96 |

Primary Examiner—Stuart N. Hecker
Assistant Examiner—Melissa J. Koval
Attorney, Agent, or Firm—Fliesler, Dubb, Meyer & Lovejoy

[57] ABSTRACT

An apparatus for programming an ECL PROM comprises conventional ECL row and column address circuits for selecting a particular fuse in the ECL PROM. The selection of a particular fuse in the ECL PROM generates a control signal in the address decoders corresponding thereto which enables a current drive gate and a current sink gate coupled thereto. A row program control circuit and a column program circuit are then enabled by an increase of potential applied thereto for turning on the current drive gate and the current sink gate coupled to the selected fuse. The turning on of the current drive gate and the current sink gate coupled to the selected fuse causes 50 to 10 milliamps to flow through the selected fuse, blowing the fuse.

6 Claims, 5 Drawing Sheets

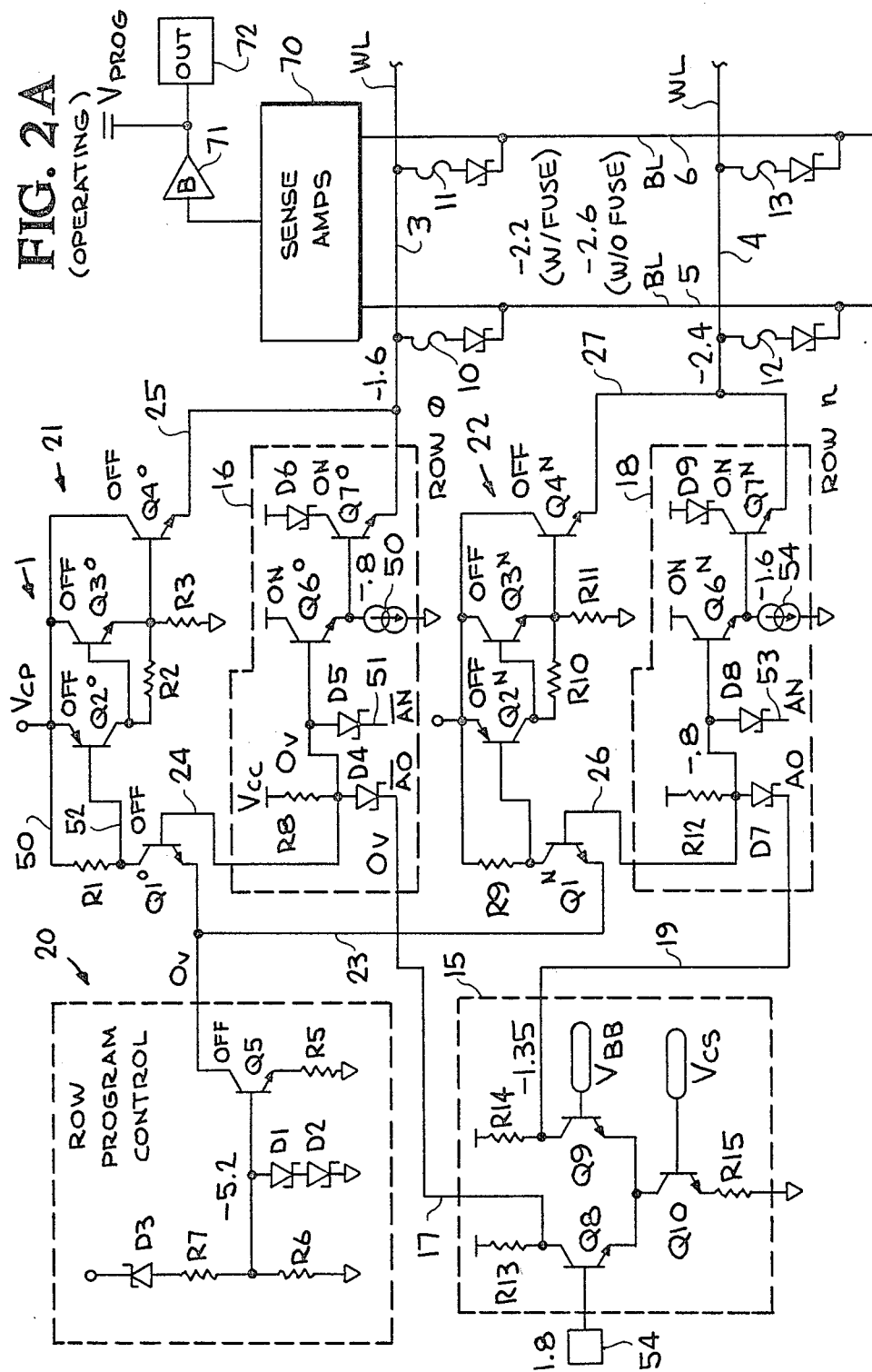
FIG. 2A (OPERATING)

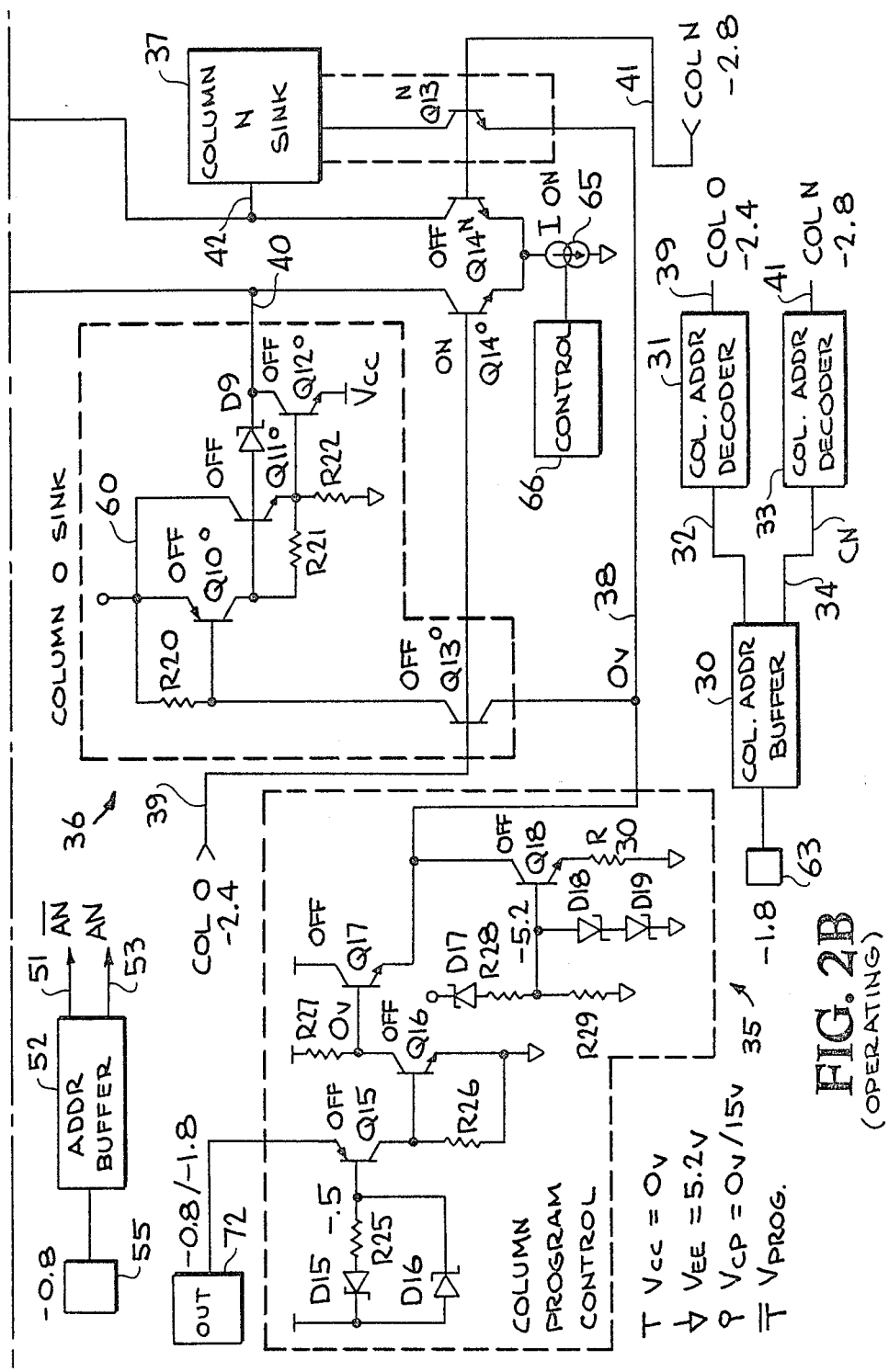
FIG. 2B (OPERATING)

FIG. 3A (PROGRAMMING)

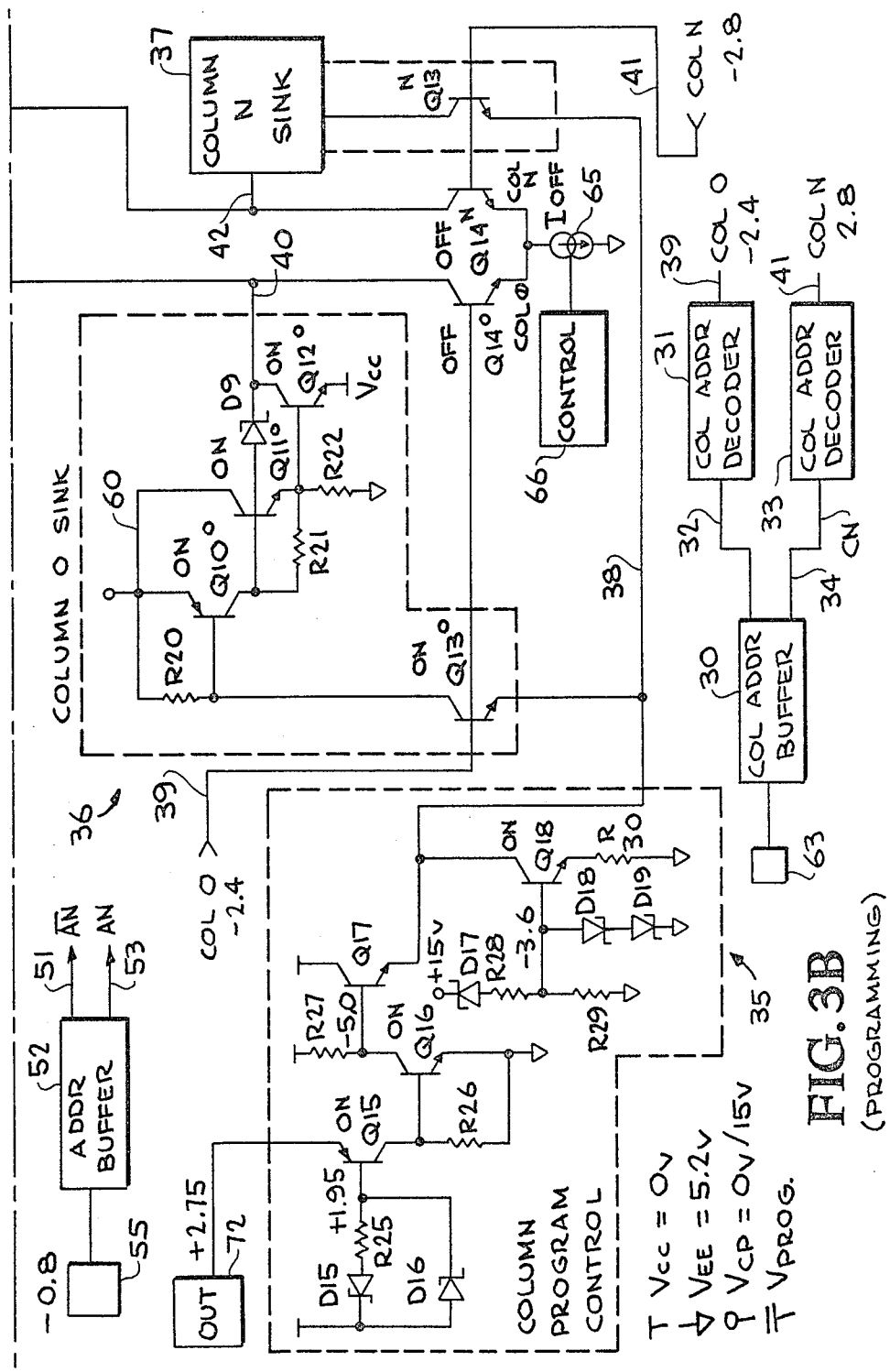
FIG.3B (PROGRAMMING)

ECL PROM PROGRAMMING METHOD AND APPARATUS USING ECL ADDRESSING MEANS

BACKGROUND OF THE INVENTION

1. Field of the Invention

The present invention relates in general to a method and apparatus for reading and programming an ECL PROM and in particular to a method and apparatus which uses the same ECL address buffers and the decoders coupled thereto for reading and programming the ECL PROM.

2. Description of Prior Art

An ECL PROM is fabricated with a plurality of rows and columns of fuses. Each of the fuses is located in the PROM at a position which is uniquely identified by a row address and a column address.

To program an ECL PROM, a particular fuse is selected by applying a corresponding row and column address to row and column address buffers which are coupled to row and column address decoders, respectively. After the address of the fuse has been decoded and the fuse has been selected, a current which has a magnitude sufficient to blow the fuse is caused to flow through the fuse, blowing the fuse.

To read the data stored in an ECL PROM, the location of one or more of the fuses is addressed also by applying a row and column address of the fuse to a row and column address buffer and decoder circuit coupled thereto. If an addressed fuse had not been blown during programming of the ECL PROM, a first predetermined output is generated from the PROM. If, on the other hand, the addressed fuse had been blown during programming of the ECL PROM, a second predetermined output is generated. The first and second predetermined outputs are complementary and represent either a logical high or a logical low.

Heretofore, the address buffer and decoder circuits used in the operating mode of a conventional ECL PROM have comprised ECL circuits and the address buffer and decoder circuits used in the programming mode of the conventional ECL PROM have comprised TTL circuits.

The above-described use of different buffer and decoder circuits for operating and programming an ECL PROM has certain disadvantages. First, it requires a significant amount of space to accommodate two complete addressing circuits. Second, the algorithms required in both the reading and programming modes are undesirably complicated due to the need for different input levels in the two modes.

SUMMARY OF THE INVENTION

In view of the foregoing, principal objects of the present invention are a method and apparatus comprising an ECL PROM in which the same conventional ECL row and column address buffers and decoders are used in both its operating and its programming modes.

In accordance with the above objects, a current driving gate and a row program control circuit are coupled to each row address decoder and a current sinking gate and column program control circuit are coupled to each column decoder.

In operation, in both the operating mode and the programming mode, a selected fuse is addressed using the same ECL row and column address buffers and decoders. However, in the programming mode the current driving and sinking gates are also enabled by the row and column decoders coupled to the selected fuse. After the current driving and sinking gates coupled to the selected fuse are enabled, the current driving and sinking gates are turned on by increasing a potential VCP applied thereto from 0 to +15 volts and by applying +2.75 volts to the column program control circuit. The increased potential causes a high current flow from the current driving gate, through the selected fuse and the current sinking gate, blowing the fuse.

The advantage of using the same ECL row and column address buffers and decoders for addressing the selected fuse in both the operating and programming modes is that a significant savings in space is achieved. Also, the algorithm used for programming and verifying the PROM is less complex due to the use of the same input levels in both modes.

BRIEF DESCRIPTION OF THE DRAWING

The above and other objects, features and advantages of the present invention will become apparent from the following detailed description of the accompanying drawing, in which:

FIGS. 2a and 2b are more detailed block diagrams and schematics of the apparatus of FIG. 1 showing selected potential levels used in the operating mode; and FIGS. 3a and 3b are more detailed block diagrams and schematics of the apparatus of FIG. 1 showing selected potential levels used in the programming mode.

DETAILED DESCRIPTION OF THE DRAWING

Figure 1:
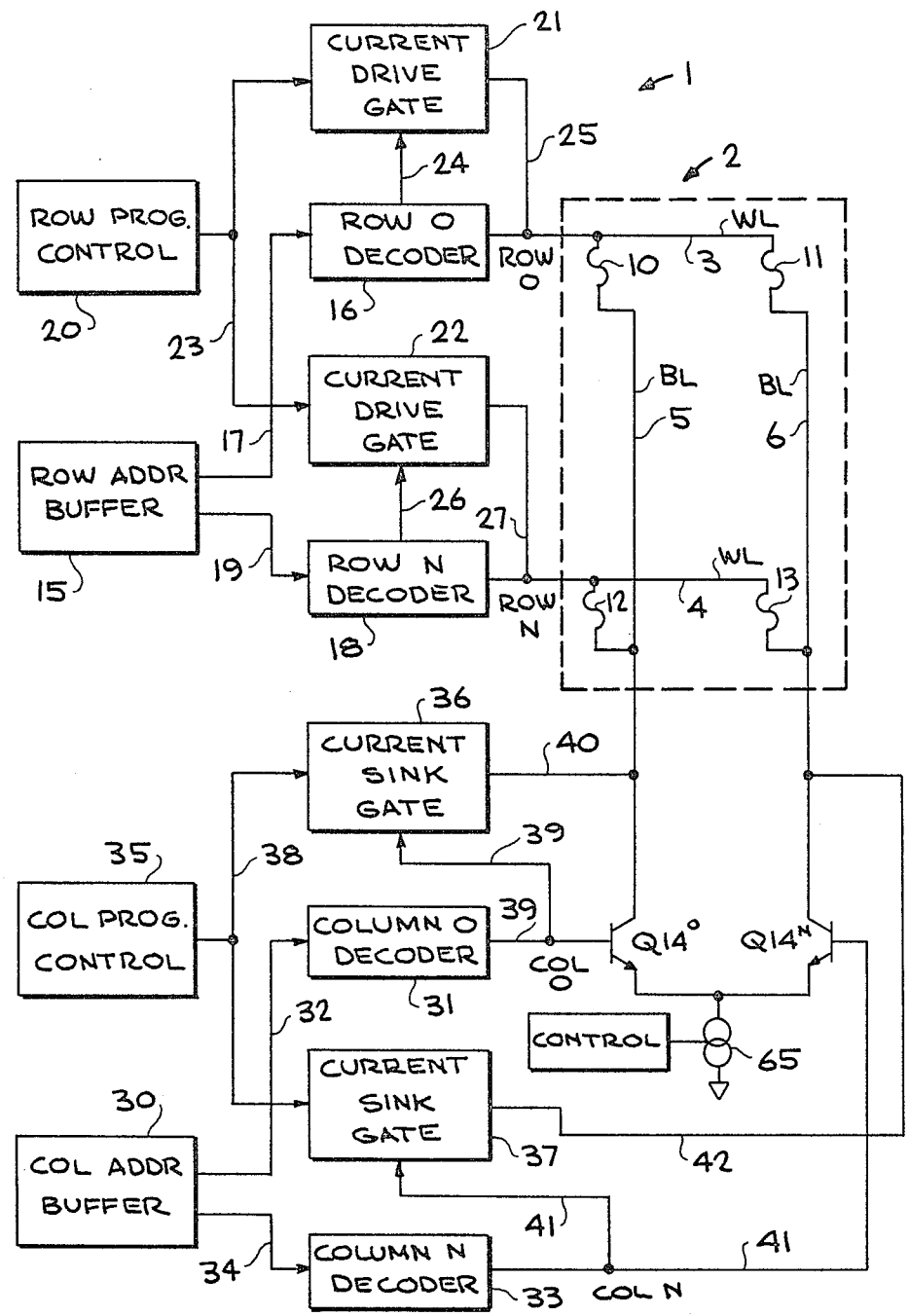
FIG. 1 is a block diagram of an ECL PROM and addressing apparatus according to the present invention.

Referring to FIG. 1, there is provided in accordance with the present invention an apparatus 1 comprising means for reading and programming an ECL PROM 2 in which the same addressing circuits are used in both the operating and the programming modes. In the apparatus 1 there is provided an ECL PROM 2. In the PROM 2 there is provided a plurality of word lines 3 and 4, also designated WL, and a plurality of bit lines 5 and 6, also designated BL. Coupled to the word line 3 there is provided a plurality of fuses 10 and 11. Coupled to the word line 4 there is provided a plurality of fuses 12 and 13. Fuses 10 and 12 are also coupled to the bit line 5. Fuses 11 and 13 are coupled to the bit line 6.

To the left of the PROM 2 there is provided a row address buffer 15 having a first output coupled to a row 0 decoder 16 by means of a line 17 and a complementary second output coupled to a row n decoder 18 by means of a line 19. Above the row address buffer 15 there is provided a row programming control circuit 20. The output of the row programming control circuit 20 is coupled to a first current drive gate 21 and a second current drive gate 22 by means of a control signal line 23. The row 0 decoder 16 is coupled to the current drive gate 21 by means of a control signal line 24. The output of the current drive gate 21 is coupled to the word line 3 by means of a line 25. Similarly, an output of the row n decoder 18 is coupled to current drive gate 22 by means of a control signal line 26. An output of the current drive gate 22 is coupled to the word line 4 by means of a line 27.

Below the row address buffer 15 there is provided a column address buffer 30. Buffer 30 has a first output coupled to a column 0 decoder 31 by means of a line 32 and a complementary second output coupled to a column n decoder 33 by means of a line 34. Above the column address buffer 30 there is provided a column program control circuit 35. Circuit 35 is coupled to a first current sink gate 36 and a second current sink gate 37 by means of a control signal line 38. An output of the column 0 decoder 31 is coupled to the current sink gate 36 by means of a control signal line 39. An input of the current sink gate 36 is coupled to the bit line 5 by means of a line 40. An output of the column n decoder 33 is coupled to current sink gate 37 by means of a control signal line 41. An input of the current sink gate 37 is coupled to bit line 6 by means of a line 42. The lines 39 and 41 are also coupled to the bases of a pair of emitter coupled transistors $Q14^0$ and $Q14^n$. The collectors of $Q14^0$ and $Q14^n$ are coupled to the bit lines 5 and 6, respectively. The emitters of $Q14^0$ and $Q14^n$ are coupled to a constant current source 65 controlled by a control circuit 66.

Referring to FIGS. 2a and 2b, the features in FIGS. 2a and 2b which are substantially identical to the features described above with respect to FIG. 1 bear the same identifying numeral. In the current drive gate circuit 21 coupled to row 0 (word line 3), there is provided a plurality of transistors $Q1^0$, $Q2^0$, $Q3^0$ and $Q4^0$. The base of transistor $Q1^0$ is coupled to the row 0 decoder 16 by means of the control signal line 24. The emitter of transistor $Q1^0$ is coupled to the row program control circuit 20 by means of the control signal line 23. The collector of the transistor $Q1^0$ is coupled to a source of potential VCP through a resistor R1. The emitter of transistor $Q2^0$ and the collectors of transistors $Q3^0$ and $Q4^0$ are connected to the source of potential VCP by a line 50. The collector of transistor $Q2^0$ is coupled to the base of $Q3^0$, to the emitter of transistor $Q3^0$ by means of a resistor R2 and to a source of reference potential VEE by means of a resistor R3. The emitter of transistor $Q3^0$ is coupled to the base of transistor $Q4^0$. The collector of transistor $Q1^0$ is coupled to the base of transistor $Q2^0$ by means of a line 52. The emitter of transistor $Q4^0$ is coupled to the row 0 word line 3 by means of the line 25.

In the row program control circuit 20 there is provided a transistor Q5, a plurality of Schottky diodes D1, D2 and a Zener diode D3 and a plurality of resistors R5, R6 and R7. The base of the transistor Q5 is coupled to the source of reference potential VEE through series coupled diodes D1 and D2 and R6 connected in parallel therewith and to the source of potential VCP through the resistor R7 and the diode D3. The emitter of transistor Q5 is coupled to the source of reference potential VEE through the resistor R5. The collector of transistor Q5 is coupled to the line 23.

In the row 0 decoder 16 there is provided a plurality of transistors $Q6^0$ and $Q7^0$, a plurality of diodes D4, D5 and D6, a resistor R8 and a constant current source 50. The base of the transistor $Q6^0$ is coupled through a resistor R8 to a source of potential VCC and to line 17 through the diode D4 and to a line 51 coupled to a first output of an address buffer 52 through the diode D5. The collector of the transistor $Q6^0$ is coupled to the source of potential VCC. The emitter of the transistor $Q6^0$ is coupled to the source of reference potential VEE through the constant current source 50 and to the base of the transistor $Q7^0$. The collector of the transistor $Q7^0$ is coupled to the source of potential VCC through the diode D6. The emitter of the transistor $Q7^0$ is coupled to the row 0 (word line 3).

In the current drive gate 22 there is also provided a plurality of transistors $Q1^n$, $Q2^n$, $Q3^n$ and $Q4^n$ which are interconnected in the manner described above with respect to the transistors $Q1^0$, $Q2^0$, $Q3^0$ and $Q4^0$ in current drive gate 21. In addition, the emitter of $Q1^n$ is coupled to the row program control circuit 20 by means of the line 23 and the emitter of the transistor $Q4^n$ is coupled to the word line 4 by means of the line 27.

In the row n decoder 18 there is provided a plurality of transistors $Q6^n$ and $Q7^n$ and a plurality of diodes D7 and D8. The transistors $Q6^n$ and $Q7^n$ and the diodes D7 and D8 are interconnected in the same manner as described above with respect to transistors $Q6^0$ and $Q7^0$ and diodes D4 and D5 in the row 0 decoder Q6 16. In addition, the diode D7 is coupled to the line 19 and the diode D8 is coupled to a second output of the address buffer 52 by means of a line 53. The emitter of the transistor $Q7^n$ is coupled to the row n word line 4. The base of the transistor $Q6^n$ is coupled to the base of the transistor $Q1^n$ by means of the control signal line 26.

In the row address buffer 15 there is provided a plurality of emitter coupled transistors Q8 and Q9. The collector of transistor Q9 is coupled to the source of potential VCC through a resistor R13 and to the diode D4 of the row 0 decoder 16 by means of the line 17. The collector of the transistor Q9 is coupled to the source of potential VCC through a resistor R14 and to the diode D7 in the row n decoder 18 by means of the line 19. The emitters of transistors Q8 and Q9 are coupled to the collector of a transistor Q10. The emitter of the transistor Q10 is coupled to the source of reference potential VEE through a resistor R15. The base of the transistor Q9 is coupled to a source of reference potential VBB and the base of the transistor Q10 is coupled to a source of reference potential VCS. The base of the transistor Q8 is coupled to an input pad 54 for receiving a bit in a row address. A corresponding network of emitter coupled transistors in the address buffer 52 is similarly coupled to an input pad 55 for receiving a second bit in a row address, as will be further described below.

In the current sink gate circuit 36 there is provided a plurality of transistors $Q10^0$, $Q11^0$ and $Q12^0$, a diode D9 and a plurality of resistors R20, R21 and R22. The base of the transistor $Q10^0$ is coupled to the potential source VCP by means of the resistor R20 and to the collector of the transistor $Q13^0$. The emitter of the transistor $Q10^0$ is coupled to the potential source VCP and to the collector of the transistor $Q11^0$ by means of a line 60. The collector of the transistor $Q10^0$ is coupled to the base of the transistor $Q11^0$ and the diode D9 and through resistor R21 to the emitter of the transistor $Q11^0$ and the base of the transistor $Q12^0$ and through the resistors R21 and R22 to the source of reference potential VEE. The emitter of the transistor $Q12^0$ is coupled to the source of potential VCC and the collector of the transistor $Q12^0$ is coupled to the diode D9 and the bit line 5. The base of the transistor $Q13^0$ is coupled to a column 0 address decoder 31 by means of a line 61. The emitter of the transistor $Q13^0$ is coupled to the line 38.

The column current sink circuit 37 is identical to the circuit 36 with the base of the transistor corresponding to transistor $Q10^0$ coupled to the collector of a transistor $Q13^n$. $Q13^n$ corresponds to the transistor $Q13^0$. The base of the transistor $Q13^0$ is coupled to the column n address decoder 33 by means of the line 39. In addition to the features described above, the column address buffer 30 is provided with an input coupled to a pad 63 for receiving a bit in a column address.

At the lower end of the bit lines 5 and 6 there is provided the transistors $Q14^0$ and $Q14^n$. The base of the transistor $Q14^0$ is coupled to the column 0 address decoder output line 39. The base of the transistor $Q14^n$ is coupled to the column n address decoder line 41. The emitters of the transistors $Q14^0$ and $Q14^n$ are tied together and coupled to the source of reference potential VEE through a constant current source 65. The collector of transistor $Q14^0$ is coupled to the bit line 5 and the transistor $Q14^n$ is coupled to the bit line 6. The constant current source 65 is also coupled to a control circuit 66 which is used for selectively turning the constant current source on and off, as will be described below.

Also coupled to the bit lines 5 and 6 there is provided a sense amp circuit 70 having an output coupled to a buffer circuit 71. The output of the buffer circuit 71 is coupled to a pad 72 and a source of potential $V_{Prog}$.

In the column program circuit 35 there is provided a plurality of transistors Q15, Q16, Q17 and Q18, a plurality of diodes D15, D16, D17, D18 and D19 and a plurality of resistors R25, R26, R27, R28, R29 and R30. The base of the transistor Q15 is coupled through the resistor R25 and the diode D15 to the source of potential VCC. The diode D16 is coupled in parallel with the diode D15 and resistor R25. The emitter of the transistor Q15 is coupled to the pad 72. The collector of the transistor Q15 is coupled to the base of transistor Q16 and through a resistor R25 to the source of reference potential VEE and the emitter of transistor Q16. The collector of transistor Q16 is coupled to the base of transistor Q17 and through a resistor R27 to the source of potential VCC. The collector of the transistor Q17 is coupled to the source of potential VCC. The emitter of the transistor Q17 is coupled to the line 38. The base of the transistor Q18 is coupled to the source of reference potential VEE through series coupled diodes D18 and D19 and through a resistor R29 coupled in parallel thereto and to a source of potential VCP through resistor R28 and diode D17. The emitter of transistor Q18 is coupled to the reference potential through a resistor R30. The collector of the transistor Q18 is coupled to the line 38.

The apparatus of the present invention comprises an operating mode and a programming mode. In both the operating mode and the programming mode a row address and a column address are used to select one of the rows and one of the columns in the PROM 2. For example, referring to FIG. 2 and the potential levels indicated therein, if a fuse connected between row 0 and column 0 is to be selected, a typical ECL potential level of $-1.8$ volts (which corresponds to a logical low) is applied to the pad 54 of the row address buffer 15 and to the pad 63 of the column address buffer 30. In the row input buffer 15, the potential of $-1.8$ volts turns off transistor Q8 and turns on transistor Q9, which results in a potential of 0 volts appearing on the line 17 and a potential of $-1.35$ volts appearing on the line 19. The potential of 0 volts on the line 17 results in a potential of $-1.6$ volts on the word line 3 and a potential of $-2.4$ volts on the word line 4. The potential of $-1.8$ volts applied to the column address buffer 30 results in a potential of $-2.4$ volts on the line 39 coupled to the base of the transistor $Q14^0$ which turns on the transistor $Q14^0$ and a potential of $-2.8$ volts on the line 41 coupled to the base of transistor $Q14^n$ which turns off the transistor $Q14^n$. With the constant current source 65 turned on by the control circuit 66, the above-described potentials in cooperation with the sense amplifiers 70 produces on bit line 5 a potential of $-2.2$ volts if the fuse 10 coupled between the word line 3 and bit line 5 is intact and a potential of $-2.6$ volts if the fuse 10 is not intact. The sense amplifiers 70 are provided with means for providing an output on the output pad 72 which corresponds to the two possible potentials appearing on the bit line 5. For example, if the potential of $-2.2$ volts represents a logical low, the sense amplifiers 70 will provide a potential of $-1.8$ volts on the output pad 72. If the potential of $-2.6$ volts represents a logical high, the sense amplifiers 70 will produce a potential of $-0.8$ volts on the output pad 72. These output potential levels are chosen to be generally compatible with conventional ECL circuits with which the present invention is intended to be used.

The operation of the apparatus of the present invention in its operating mode is described above with respect to a single row address bit and a single column address bit. These are all the bits required to select one of the fuses 10–13. If additional fuses are coupled to additional word lines and/or bit lines, additional row and column address buffers and decoder gates are required. For example, with the addition of the address buffer 52 and its outputs AN and $\overline{AN}$, four additional fuses coupled to two additional word lines and the bit lines 5 and 6 may be addressed by two additional row address decoder gates in a conventional manner.

It should be noted that in the operating mode the potential VCP is 0 and consequently, the row program control circuit 20, the current drive gates 21 and 22, the column program control circuit 35 and the current sink gates 36 and 37 are not active.

Figure 3A:
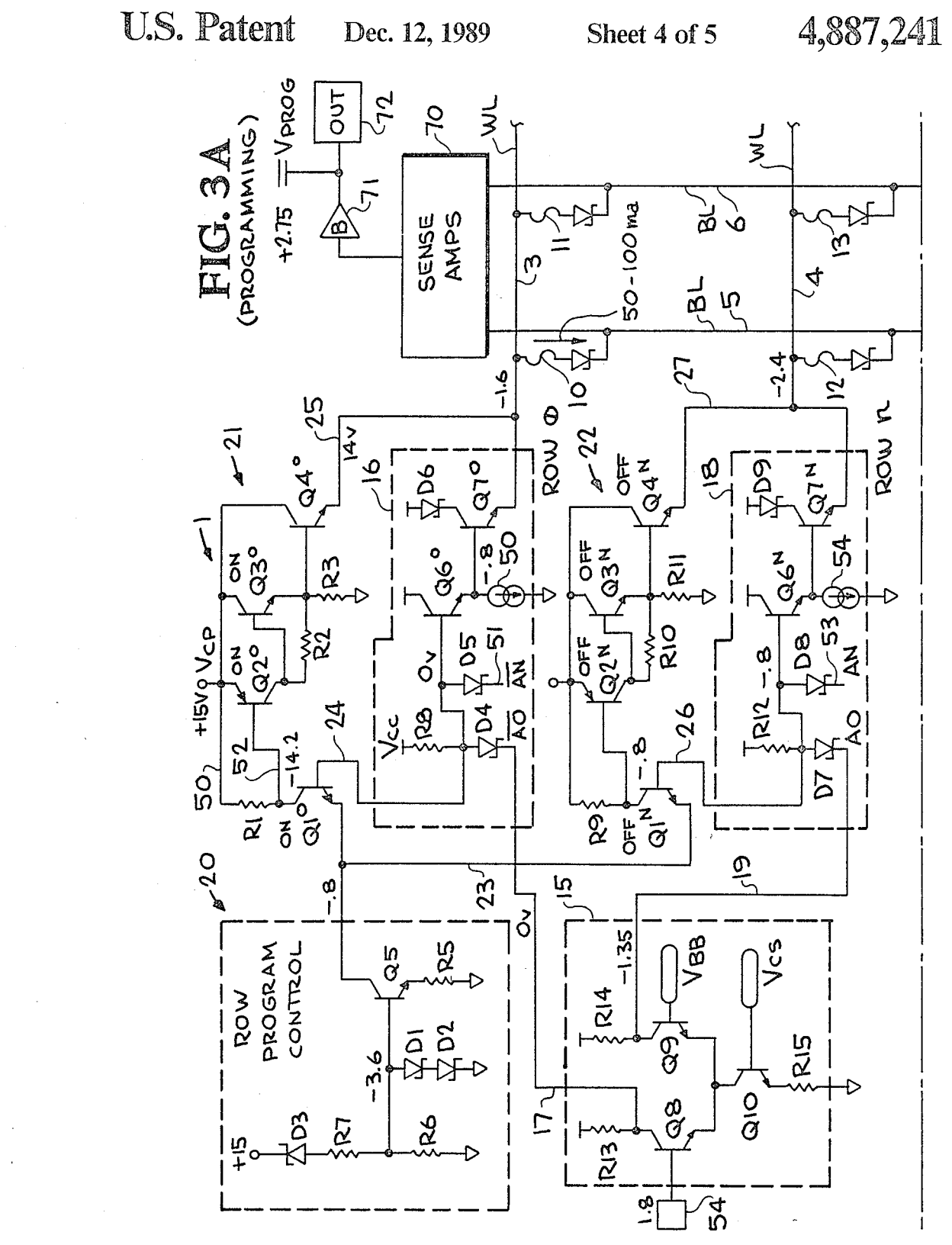

Referring to FIGS. 3a, and 3b the potential levels indicated therein, in the programming mode, one or more of the fuses 10-13 are blown. For example, to blow the fuse 10, row 0 (word line 3) and column 0 (bit line 5) are selected by applying a potential of $-1.8$ volts to the pads 54 and 63 of the row and column address buffers 15 and 30, respectively. This is the same means and method used in the selection of the fuse 10 in the operating mode. With the selection of fuse 10, the base of transistor $Q6^0$ is at 0 volts. This is because none of the diodes connected thereto is conducting. Thereafter, the potential of VCP is raised from 0 volts to $+15$ volts. With 0 volts on the base of the transistor $Q6^0$, the transistor $Q1^0$ is enabled. With the potential VCP increased from 0 volts to $+15$ volts, the row program control circuit 20 provides a potential of $-3.6$ volts on the base of the transistor Q5 and the collector of transistor Q5 is reduced from 0 volts to $-0.8$ volts, turning on the transistor $Q1^0$. When transistor $Q1^0$ turns on, transistors $Q2^0$, $Q3^0$ and $Q4^0$ are turned on, providing a potential of approximately 14 volts on the emitter of transistor $Q4^0$.

At this time, control circuit 66 controlling the constant current source 65 is activated to turn off the constant current source 65 so that none of the fuses are inadvertently blown due to the activation of the row program control circuit 20 and the current drive gate 21. With constant current source 65 turned off, no current will flow through transistors $Q14^0$ or $Q14^n$. However, transistor $Q13^0$ is enabled by the potential of $-2.4$ volts applied to the column 0 control line 39.

Initially, the increase of potential VCP from 0 to 15 volts will increase the potential on the base of the transistor Q18 from $-5.2$ volts to $-3.6$ volts turning on the transistor Q18. When transistor Q18 turns on, current will flow from the emitter circuit of transistor Q17 through the collector emitter circuit of transistor Q18.

At this time, transistors $Q13^0$ and transistors $Q13^n$ are off due to the fact that the potential, i.e. 0 volts, on the base of transistor Q17 is at a higher potential than the potential on the base of transistors $Q13^0$ and transistors $Q13^n$. Thereafter, +2.75 volts is applied to the output pad 72 coupled to the column program control circuit 35. When the potential of +2.75 volts is applied to the output pad 72, the potential on the base of the transistor Q15 is increased from −0.5 volts to +1.95 volts, turning on transistor Q15. When transistor Q15 is turned on, transistor Q16 is turned on, dropping the potential on the base of the transistor Q17 from 0 volts to −5.0 volts, turning off transistor Q17. When transistor Q17 turns off, transistor $Q13^0$ turns on. When transistor $Q13^0$ turns on, transistors $Q10^0$, $Q11^0$ and $Q12^0$ turn on, current flows through the emitter circuit of the transitor $Q4^0$ in the current drive gate 21 through the fuse 10 and the transistor $Q12^0$ in the column 0 sink circuit 36, blowing the fuse 10. The magnitude of the current is in the range of 50 to 100 milliamperes.

The foregoing description of the preferred embodiment of the present invention has been presented for purposes of illustration and description. It is not intended to be exhaustive or to limit the invention to the precise form disclosed. Obviously, many modifications and variations will be apparent to practitioners skilled in this art. The embodiment was chosen and described in order to best explain the principles of the invention and its practical application, thereby enabling others skilled in the art to understand the invention for various embodiments and with various modifications as are suited to the particular use contemplated. It is intended that the scope of the invention be defined by the claims appended hereto and their equivalents.

What is claimed is:

1. An apparatus for reading and programming an ECL PROM having a plurality of addressable fuses comprising:
   an ECL row address buffer having complementary first and second outputs;
   a first row decoder gate coupled to said first output of said ECL row address buffer;
   a second row decoder gate coupled to said second output of said ECL row address buffer;
   a first current driving gate circuit coupled to said first row decoder gate;
   a second current driving gate circuit coupled to said second row decoder gate;
   a row program control circuit coupled to said first and said second current driving gate circuits for providing a row control signal when a selected one of said fuses is to be blown;
   first means for coupling a first and a second one of said plurality of fuses to said first row decoder and said first current driving gate;
   second means for coupling a third and a fourth one of said plurality of fuses to said second row decoder gate and said second current driving gate;
   an ECL column address buffer having complementary first and second outputs;
   a first column decoder coupled to said first output of said ECL column address buffer;
   a second column decoder coupled to said second output of said ECL column address buffer;
   a first current sinking gate coupled to said first column decoder gate circuit;
   a second circuit sinking gate coupled to said second column decoder gate;
   a column program control circuit coupled to said first and said second current sinking gates for providing a column control signal when a selected one of said fuses is to be blown;
   third means for coupling said first and said third one of said plurality of fuses to said first column decoder gate and said first current sinking gate;
   fourth means for coupling said second and said fourth one of said plurality of fuses to said second column decoder and said second current sinking gate;
   means located in said row and column decoders which is responsive to outputs from said row and column address buffers corresponding to a selected one of said fuses for providing first and second signals corresponding to said selected one of said fuses, respectively, when said selected one of said fuses is selected; and
   means located in said current driving gates and said current sinking gates which is responsive to said first and said second signals, said row control signal and said column control signal for causing a current to flow through said selected fuse which has a magnitude sufficient to blow said fuse.

2. An apparatus for reading and programming an ECL PROM having a plurality of word lines, a plurality of bit lines, a plurality of fuses, means for coupling a predetermined number of said plurality of fuses to each of said word lines, means for coupling each of said predetermined number of said plurality of fuses to a different one of said plurality of bit lines; and row and column addressing means including emitter coupled transistor means which is responsive to a row and a column address coupled to said word lines and said bit lines for selecting a fuse coupled between one of said plurality of word lines and one of said plurality of bit lines comprising:
   a plurality of current driving gates;
   means for coupling one of said current driving gates to each of said plurality of word lines;
   means in said row addressing means for providing a word line selected control signal corresponding to a word line selected by said row address;
   row programming control means responsive to a predetermined change in potential applied thereto for generating a row program control signal when a fuse coupled to said selected word line is to be blown;
   means for coupling said row program control signal to each of said plurality of current driving gates;
   means in said current driving gate coupled to said selected word line which is responsive to said word line selected control signal, said row program control signal and a predetermined change in potential applied thereto for enabling said current driving gate coupled to said selected word line to provide a predetermined current to said selected word line;
   a plurality of current sinking gates;
   means for coupling one of said current sinking gates to each of said plurality of bit lines;
   means in said column addressing means for providing a bit line selected control signal corresponding to a bit line selected by said column address;
   column programming control means responsive to a predetermined change in potential and an external control signal applied thereto for generating a column program control signal when a fuse coupled to said selected bit line is to be blown;

means for coupling said column program control signal to each of said current sinking gates; and means in said current sinking gate coupled to said selected bit line which is responsive to said column program control signal and a predetermined change in potential applied thereto for sinking said predetermined current through said selected fuse coupled between said selected word line and said selected bit line.

3. An apparatus according to claim 2 wherein each of said current driving gates comprises:

a first, second, third and fourth transistor;

means for coupling the collector of said first transistor, the emitter of said second transistor and the collectors of said third and fourth transistors to a source of said predetermined change in potential and to the base of said second transistor; and means for coupling the collector of said second transistor to a reference potential, the base and emitter of said third transistor and the base of said fourth transistor; and said means for coupling one of said current driving gates to each of said plurality of word lines comprises means for coupling the emitter of said fourth transistor to said word line.

4. An apparatus according to claim 2 wherein said row addressing means comprises:

a plurality of row decoding circuits, each of said row decoding circuits having a plurality of diodes;

a plurality of emitter coupled transistor row address buffer circuits, each of said circuits having means for providing complementary first and second outputs in response to a bit in a row address;

means for coupling said first and said second outputs to a first electrode of one of said diodes in each of two of said row decoding circuits;

means for coupling a second electrode of each of said diodes to a source of potential; and said means for providing said word line select control signal comprises a node located between said second electrode of said diode and said source of potential.

5. An apparatus according to claim 2 wherein said row program control signal generating means comprises:

a transistor;

a first diode circuit means;

a second diode circuit means;

means for coupling said first diode circuit means to a source of said predetermined change of potential, the base of said transistor and a reference potential;

means for coupling said second diode circuit means between said base of said transistor and said reference potential; and means for coupling the emitter of said transistor to said reference potential; and said means for coupling said row program control signal to each of said plurality of current driving gates comprises means for coupling the collector of said transistor to each of said current driving gates.

6. An apparatus according to claim 2 wherein said column program control signal generating means comprises:

a first, second, third and fourth transistor;

means for coupling the base of said first transistor to a source of potential;

means for coupling the emitter of said first transistor to a source of said external control signal;

means for coupling the collector of said first transistor to a reference potential and the base and emitter of said second transistor;

means for coupling the collector of said second transistor to a source of potential and the base of said third transistor;

means for coupling the collector of said third transistor to said source of potential;

means for coupling the emitter of said third transistor to the collector of said fourth transistor;

a first and a second diode circuit means;

means for coupling said first diode circuit means to a source of said predetermined change in potential, a reference potential and the base of said fourth transistor; and means for coupling the emitter of said fourth transistor to said source of reference potential, and said means of coupling said column program control signal to each of said current sinking gates comprises:

means for coupling said emitter of said third transistor and said collector of said fourth transistor to said current sinking gates for turning on the current sinking gate coupled to said selected bit line.

* * * * *